(12) United States Patent
Senda

(10) Patent No.: US 7,301,485 B2
(45) Date of Patent: Nov. 27, 2007

(54) DECODING DEVICE OR ENCODING DEVICE HAVING INTERMEDIATE BUFFER INTERPOSED BETWEEN AN ARITHMETIC CODE DECODER OR ENCODER AND A REVERSE BINARIZATION DEVICE OR BINARIZATION DEVICE

(75) Inventor: Yuzo Senda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/577,146

(22) PCT Filed: Oct. 28, 2004

(86) PCT No.: PCT/JP2004/015981

§ 371 (c)(1),
(2), (4) Date: Apr. 26, 2006

(87) PCT Pub. No.: WO2005/041420

PCT Pub. Date: May 6, 2005

(65) Prior Publication Data

US 2007/0040708 A1  Feb. 22, 2007

(30) Foreign Application Priority Data

Oct. 29, 2003  (JP) .............................. 2003-369176

(51) Int. Cl.
*H03M 7/00* (2006.01)
(52) U.S. Cl. .......................... 341/107; 351/50; 351/51; 351/59; 351/67; 351/81; 382/166; 382/247
(58) Field of Classification Search ................ 341/50, 341/51, 59, 67, 81, 107; 382/166, 247
See application file for complete search history.

(56) References Cited

U.S. PATENT DOCUMENTS

| 6,072,909 A | 6/2000 | Yokose et al. |
| 6,118,900 A | 9/2000 | Yokose et al. |
| 6,373,408 B1 | 4/2002 | Kimura et al. |
| 6,677,869 B2 | 1/2004 | Horie |

FOREIGN PATENT DOCUMENTS

| JP | 05-176187 | 7/1993 |
| JP | 06-097834 | 4/1994 |
| JP | 09-009256 | 1/1997 |
| JP | 09-130617 | 5/1997 |
| JP | 11-055531 | 2/1999 |
| JP | 2000-299641 A | 10/2000 |
| JP | 2000-350043 A | 12/2000 |
| JP | 2001-230935 A | 8/2001 |
| JP | 2003-209699 A | 7/2003 |

OTHER PUBLICATIONS

T. Suzuki, "MPEG-4AVCIH. 264 no Gaiyo to Hyojunka Doko," Information Processing Society of Japan, Kenkyu Hokoku, vol. 2002, No. 106, pp. 69-73, Nov. 15, 2002.

(Continued)

*Primary Examiner*—Jean Bruner Jeanglaude
(74) *Attorney, Agent, or Firm*—Foley & Lardner LLP

(57) ABSTRACT

In the decoder of binary arithmetic code of the present invention, the decoding and reverse binarization of arithmetic code are separated and a large intermediate buffer is interposed. The decoding of arithmetic code is first carried out at the time of input of a stream, whereby the arithmetic code can be decoded at the maximum input bit rate of the decoder. The obtained binary symbol string is first held in the intermediate buffer, following which the reverse binarization from the binary symbol string to multivalued symbols is carried out matched to the processing of the block decoder of the next stage.

12 Claims, 8 Drawing Sheets

OTHER PUBLICATIONS

D. Marpe, "Context-based Adaptive Binary Arithmetic Coding in the H.24/AVC Video Compression Standard," IEEE Transactions on Circuits and Systems for Video Technology, vol. 13:7, pp. 620-636, Jul. 2003.

D. Marpe et al., "Context-based Adaptive Binary Arithmetic Coding in JVT/H.26L," IEEE International Conference on Image Processing, pp. II-513-II-536, vol. 13 No. 7, Jul. 2003.

D. Marpe et al., "Video Compression Using Context-based Adaptive Arithmetic Coding," 2001 IEEE International Conference on Image Processing, pp. 558-561, month unknown.

Draft ITU-T Recommendation and Final Draft International Standard of Joint Video Specification (ITU-T Rec. H.264/ISO/IEC 14495-10 AVC, May 27, 2002. pp. 1-253 XP002409430.

DECODING DEVICE OR ENCODING DEVICE HAVING INTERMEDIATE BUFFER INTERPOSED BETWEEN AN ARITHMETIC CODE DECODER OR ENCODER AND A REVERSE BINARIZATION DEVICE OR BINARIZATION DEVICE

CROSS-REFERENCE TO RELATED PATENT APPLICATIONS

Embodiments of the present invention relate to PCT/JP04/15981, filed Oct. 28, 2004, entitled "DECODING DEVICE OR ENCODING DEVICE HAVING INTERMEDIATE BUFFER INTERPOSED BETWEEN AN ARITHMETIC CODE DECODER OR ENCODER AND A REVERSE BINARIZATION DEVICE OR BINARIZATION DEVICE", the contents of which are incorporated by reference herein and which is a basis for a claim for priority.

TECHNICAL FIELD

The present invention relates to arithmetic decoding and arithmetic encoding. More particularly, the present invention relates to the packaging of decoding and encoding of the arithmetic code of a binary symbol string in which multi-valued symbols have undergone binarization.

BACKGROUND ART

Binary arithmetic encoding is one compression encoding technique. In binary arithmetic encoding, one multivalued symbol is subjected to binarization to generate a binary symbol string, and this binary symbol string is then subjected to arithmetic encoding to obtain a final binary arithmetic code. Arithmetic code has a higher processing cost than Huffman code and has only been employed in applications that do not demand real-time capabilities, examples being file compression and still picture compression. However, with the higher speeds realized in LSI in recent years, arithmetic code has come to be used in the encoding of images. One example is the Main Profile of International Standards H.264 of the new video codec that was established by the International Telecommunication Union Telecommunication Standardization Sector (ITU-T).

In H. 264, binary arithmetic coding is called "Context-based Adaptive Binary Arithmetic Coding (CABAC)". Details regarding CABAC have been described in International Conferences on Image Processing (ICIP) of the IEEE under the title of "Context-based adaptive binary arithmetic coding in JVT/H. 26L" by D. Marpe et al. at the 2002 conference (2002 IEEE International Conference on Image Processing, ISBN:0-7803-7623-4 IEEE Catalog No. 02CH37396, pages 2-513-2-536); and under the title of "Video compression using context-based adaptive arithmetic coding" at the 2001 conference (2001 IEEE International Conference on Image Processing, ISBN: 0-7803-6725-1, pages 558-561).

In CABAC, multivalued symbols that are to be encoded first undergo binarization to a string of binary symbols (Bin), and each Bin then undergoes binary arithmetic encoding in accordance with probability estimate values for contexts that are determined for each Bin. In binarization, numbers are set to a format that is stipulated by formulas to convert multiple values to a bit pattern, but this can be considered as simple variable-length coding (VLC). Circumstances that can be used in the selection of contexts include the object of representation of the original multivalued symbols, the parameters of surrounding blocks, and the order in a binary symbol string. In decoding, on the other hand, probability estimate values are found from the contexts of the binary symbols that are now to be decoded and the arithmetic code is then decoded. If the binary symbols are restored, the probability estimate values are updated, and further, the contexts of the binary symbols that are to be decoded next are selected.

In ideal arithmetic encoding, data can be compressed to the limit of entropy, and infinite Bin can be logically expressed by one bit. However, because this is difficult to package in practice, in CABAC, simplified arithmetic encoding is adopted and an upper limit is placed on the average number of Bin per bit. For simplification, multiplication is substituted by referring to tables, and the computation required for decoding one Bin is thus limited to referring to tables, comparison, and subtraction.

In binary arithmetic encoding such as H. 264 CABAC, the processing cost of decoding and encoding arithmetic code is high.

FIG. 1 shows the overall configuration of an H. 264 decoder.

An H. 264 decoder is of a configuration that includes: CPB buffer 41 for receiving and holding a stream; and instant decoder 42 for decoding each frame by frame intervals. Instant decoder 42 is made up from CABAC decoder 43 and block decoder 44. Block decoder 44 performs reverse quantizing, inverse discrete integer transform, motion compensation prediction, and an in-loop filter process, and has a processing cost that is proportional to the number of picture elements.

In contrast, the processing cost of CABAC decoder 43 is proportional to the number of Bin.

FIG. 2 shows the details of a CABAC decoder.

CABAC decoder 51 is made up from binary arithmetic code decoder 54, reverse binarization unit 55, memory 52 for saving probability estimate values for each context; and control unit 53 for controlling these components. The processing unit is the decoding of Bin, and control unit 53 both updates the probability estimate values with each decoding of Bin, and further causes internal state to transition in accordance with the grammar of the H. 264 standards. These processes cannot be carried out together for a plurality of Bin, and the number of Bin therefore determines the processing cost.

The actual processing cost is next calculated. The compression rate for each frame differs with the coding type of the frames (within frames or between frames) and the degree of prediction accuracy or image quality, and the number of bits in each frame therefore fluctuates with each frame. In other words, the processing cost of a CABAC decoder fluctuates with each frame. According to the standard, the maximum number of bits for one frame is given by:

2048×Max MBPS×Delta Time×Chroma Format Factor/MinCR, and if this is converted to the maximum bit rate for the frame interval average, then:

2048×Max MBPS×Chroma Format Factor/MinCR.

Here, Max MBPS is the maximum number of macroblocks per second, Delta Time is the frame time interval, Chroma Format Factor is the sample number ratio when a color signal is added to the luminance signal, and MinCR is the minimum compression rate.

In Level 4.1 described in Annex A, Max MBPS is 245760, Chroma Format Factor is 1.5, and MinCR is 2, with the result that the maximum bit rate is 377 Mbps. The Bin-to-bit compression rate is prescribed to be 1.33 or less, and converting this to the maximum Bin rate yields 503 Mbin/sec. Because the maximum bit rate is found from the frame interval average, the maximum Bin rate in this case is a value obtained by dividing the number of Bin that are to be processed in the frame interval average by the frame interval. If the performance of the decoder cannot attain this maximum Bin rate, the decoding process will not be completed by the time that the frame is to be displayed, resulting in the deletion of the frame, i.e., a severe deterioration in image quality.

The preceding explanation regarding the packaging of a decoder also applies for the case of an encoder for performing the reverse operation.

FIG. 3 shows the configuration of an H. 264 encoder.

Block encoder 63 performs such operations as motion compensation prediction, discrete integer transform, quantization, reverse quantization, inverse discrete integer transform, and an in-loop filter process at the rate of picture element input. Block information is then converted to a Bin string by binary converter 64. The Bin string is converted to a coded bit string by arithmetic encoder 65, and then sent to output buffer 66. The amount of accumulation of output buffer 66 is fed back to block encoder 63 and used in the control of the coding amount in block encoder 63.

In binarization, one element of block information, such as the conversion coefficient, is converted to a plurality of Bin. As a result, the generation speed of a Bin string is at least ten times the picture element rate in bursts. Control unit 62 that subsequently handles the Bin string, as well as memory 61 and arithmetic encoder 65, must operate at this speed. If the processing between frames is considered, the maximum Bin rate of an H. 264 encoder is 503 Mbin/sec, the same as for an H. 264 decoder.

In the prior art, real-time processing at high bit rates is still problematic. For example, if the decoding process is performed as prescribed in the H. 264 standards, the Bin rate that is to be processed becomes an unrealistic value. The maximum Bin rate that satisfies the H. 264 Level 4.1 standard is 503 Mbin/sec, and even if one Bin were processed in two cycles, a CABAC decoder or arithmetic encoder must be operated at a frequency of 1 GHz or more. This value is a speed that is several times greater than can be readily realized at low cost by current LSI.

DISCLOSURE OF THE INVENTION

It is an object of the present invention to provide an encoder for encoding and a decoder for decoding binary arithmetic code in real time at a lower maximum Bin rate than the prior art.

To achieve the above-described object, the decoder of the present invention includes: an arithmetic code decoding means for decoding binary arithmetic code in accordance with the input of binary arithmetic code to obtain binary symbols; a buffer for accumulating binary symbols that have been decoded; and a reverse binarization means for, when extracting binary symbols from the buffer, extracting binary symbols in accordance with the output of the reverse binarization means, converting to multivalued symbols, and supplying the result.

In this configuration, the arithmetic code decoding means and the reverse binarization means operate independently, and normally proceed with processing at different speeds.

To achieve the above-described object, the encoder of the present invention includes: binarization means for converting multivalued symbols to binary symbols in accordance with the input of multivalued symbols; a buffer for accumulating binary symbols, and an arithmetic encoding means for, when extracting binary symbols from the buffer, extracting binary symbols in accordance with the output of the arithmetic encoding means, and generating binary arithmetic code.

In this configuration, the arithmetic encoding means and the binarization means normally proceed with processing at different speeds. The processing performance that is to be achieved by the arithmetic encoding means can be prescribed to be the maximum value of the output code rate. On the other hand, processing in units of multivalued symbols is possible in the binarization means, whereby the processing performance that is to be achieved by the binarization means can be prescribed to be the maximum value of the input multivalued symbol rate.

According to the present invention, the maximum value of the binary symbol processing rate that is to be achieved by the decoder and encoder of binary arithmetic code can be greatly decreased. The processing performance to be achieved by the arithmetic code decoding means of the present invention can be prescribed to be the maximum value of the input code rate, and similarly, the processing performance that is to be achieved by the arithmetic code encoding means can be prescribed to be the maximum value of the output code rate.

As an example, when applied to Level 4.1 of H. 264, the maximum video bit rate is 50M bps, and the maximum Bin rate is therefore 66.7 Mbin/sec. This value is less than or equal to one-seventh that of the prior art, whereby it can be seen that packaging is greatly facilitated.

In the prior art, the CPB buffer held the stream, but this buffer is unnecessary in the present invention. Instead, a memory means that is slightly larger than the CPB buffer is required. In the case of H. 264, the compression rate of arithmetic code is suppressed to 1.33 or less, and the memory means may be 1.33 larger than a CPB buffer.

The encoder of the present invention includes a buffer for binary or multivalued symbols and is therefore slowed to the extent of the buffer delay, but the encoder can instead provide estimation values that are free of delay because the actual code bit number that is generated by the bit number estimation means can be obtained. In cases requiring control of the amount of encoding such as for a video encoder, the use of generated bit number that is delayed results in instability in control, but the use of the estimated values in the present invention allows a suppression of the influence of the buffer delay.

BEST MODE FOR CARRYING OUT THE INVENTION

The arithmetic code decoder of the present invention is provided with: an arithmetic code decoder for decoding in accordance with the input of binary arithmetic code to obtain binary symbols; an intermediate buffer for storing binary symbols; and a reverse binarization means for extracting a binary symbol string from the intermediate buffer to convert to multivalued symbols and supply the result, and, in accordance with the output of these multivalued symbols, extracting a binary symbol string from the intermediate buffer.

In addition, the arithmetic code encoder of the present invention is provided with: a binarization means for converting multivalued symbols to binary symbols in accordance with the input of multivalued symbols; a buffer for storing binary symbols; and an arithmetic encoding means for, when extracting binary symbols from the buffer, extracting binary symbols in accordance with its own output to generate binary arithmetic code.

Another arithmetic code decoder of the present invention is provided with: an arithmetic code decoding means for decoding arithmetic code in accordance with the input of arithmetic code to obtain multivalued symbols; a buffer for storing multivalued symbols; and a reverse conversion means for, when extracting multivalued symbols from the buffer, extracting multivalued symbols in accordance with its own output to convert to output symbols and supply the result as output.

Another arithmetic code encoder of the present invention is provided with: conversion means for converting input symbols to multivalued symbols in accordance with the input of input symbols; a buffer for storing multivalued symbols; and an arithmetic code encoding means for, when extracting multivalued symbols from the buffer, extracting multivalued symbols in accordance with its own output to generate arithmetic code.

Figure 1:
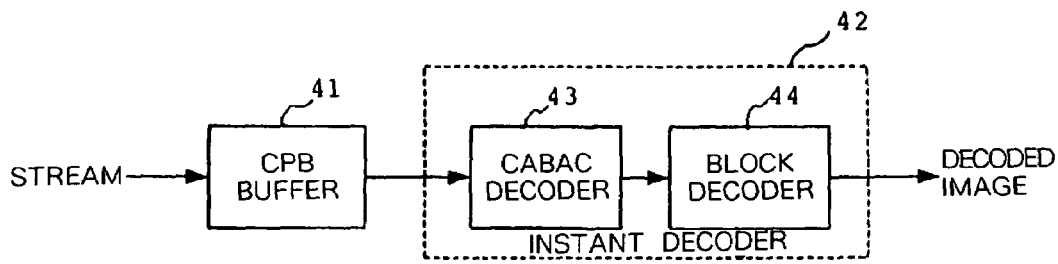
FIG. 1 is a block diagram of a decoder according to International Standard ITU-T H. 264.
Figure 2:
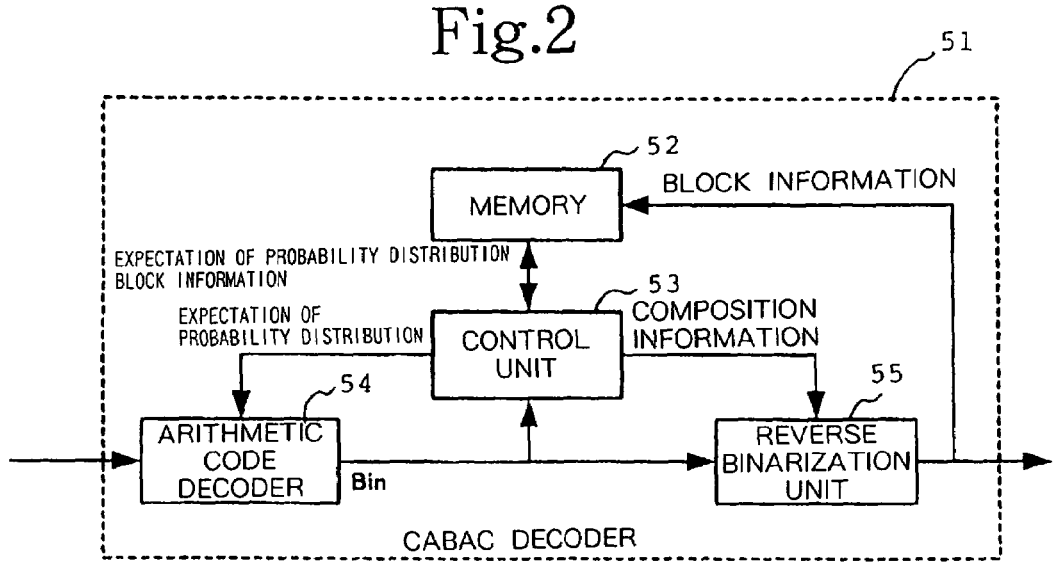
FIG. 2 is a block diagram of the interior of an H. 264 CABAC decoder.
Figure 3:
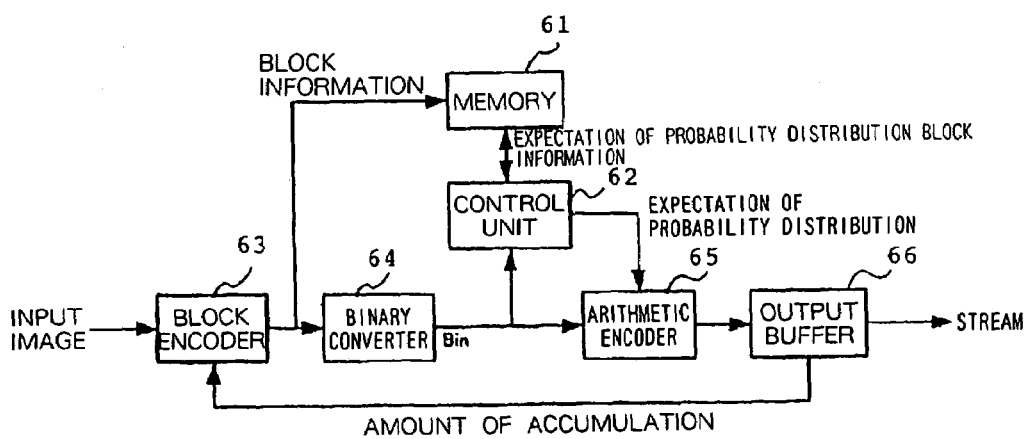
FIG. 3 is a block diagram of an H. 264 encoder.
Figure 4:
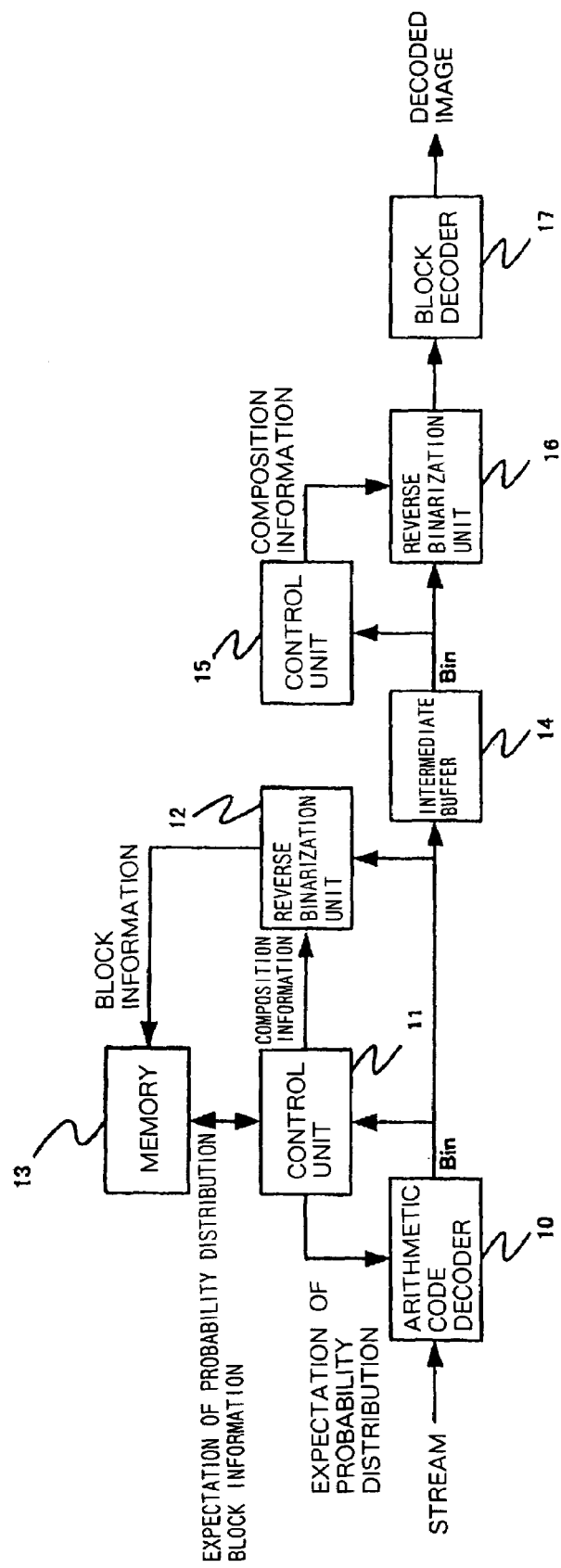
FIG. 4 is a block diagram of a video decoder that uses the binary arithmetic code decoder of the present invention.

FIG. 4 is a block diagram of a video decoder that uses the binary arithmetic code decoder of the present invention.

Arithmetic code decoder 10 decodes the arithmetic code of a stream that is received as input to obtain binary symbols (Bin), and both supplies the binary symbols to control unit 11 and reverse binarization unit 12 and stores the binary symbols in intermediate buffer 14. The probability estimate values of contexts that are necessary for decoding are supplied from control unit 11.

Control unit 11 selects contexts from binary symbols that are currently to be decoded in accordance with the grammar of the stream, and both acquires the probability estimate values from memory 13 and supplies the probability estimate values to arithmetic code decoder 10. In the selection of the contexts, block information that is stored in memory 13 is used if necessary. Control unit 11, upon obtaining binary symbols from arithmetic code decoder 10, both updates the probability estimate values that are stored in memory 13 and supplies the composition information of the binary symbol string to reverse binarization unit 12. The composition information includes, for example, parameter names that are indicated by the multivalued symbols, format information of the binary symbol string, and the timing for performing reverse conversion.

Based on the binary symbols that are supplied from arithmetic code decoder 10 and the composition information that is supplied from control unit 11, reverse binarization unit 12 converts the binary symbol string to multivalued symbols as necessary, and stores the block information that is obtained as a result in memory 13. The block information that is included in the stream includes, for example, quantized conversion coefficients, quantization parameters, effective block patterns, prediction modes, and motion vectors, but the block information that is to be stored in memory 13 is the information that is referred by control unit 11.

Intermediate buffer 14 stores binary symbols that have been obtained by arithmetic code decoder 10 and supplies binary symbols to control unit 15 and reverse binarization unit 16. Intermediate buffer 14 supplies binary symbols based on instructions from control unit 15.

Control unit 15 obtains a binary symbol string from intermediate buffer 14 in accordance with the grammar of the stream and supplies composition information to reverse binarization unit 16.

Reverse binarization unit 16 acquires a binary symbol string from intermediate buffer 14, and based on the composition information that is supplied from control unit 15, converts the binary symbol string to multivalued symbols, and supplies the block information that is obtained as a result of this process to block decoder 17.

Based on the block information that is supplied from reverse binarization unit 16, block decoder 17 carries out reverse quantization, reverse integer conversion, motion compensation prediction, and an in-loop filter process to obtain a decoded image, and supplies the obtained decoded image as output.

Arithmetic code decoder 10, control unit 11, reverse binarization unit 12, and memory 13, which constitute the block of the stage that precedes intermediate buffer 14, carry on the processing matched to the bits, bytes, or byte strings of the stream that is applied as input to arithmetic code decoder 10. In contrast, control unit 15, reverse binarization unit 16, and block decoder 17, which constitute the block that succeeds intermediate buffer 14, carry out processing that is matched to the output of the decoded image. Arithmetic code decoder 10 and reverse binarization unit 16 thus operate independently, normally carrying out processing at different speeds. Intermediate buffer 14 absorbs the difference between the processing speeds of the preceding and succeeding stages.

Figure 5:
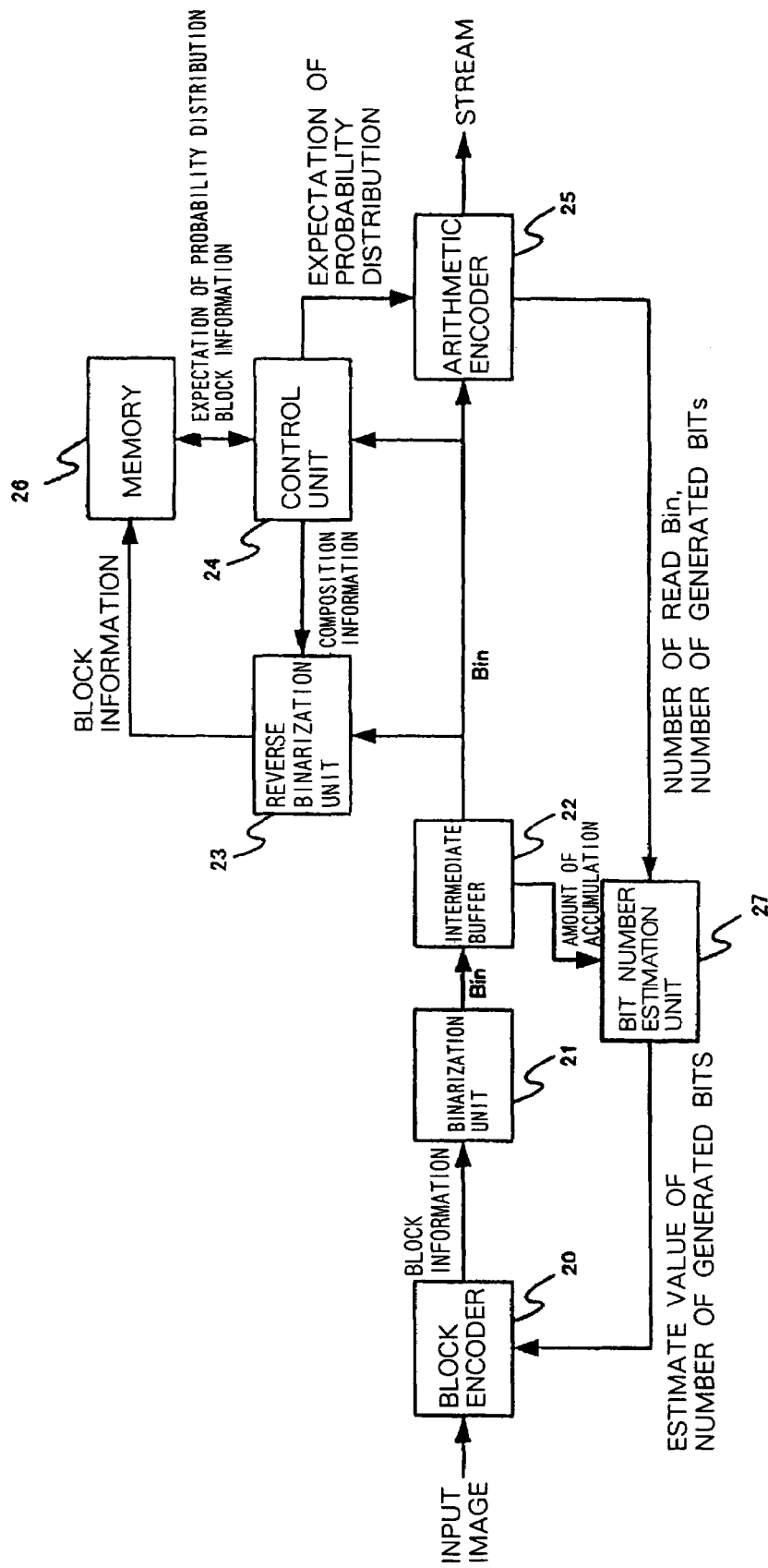
FIG. 5 is a block diagram of a video encoder that uses the binary arithmetic code encoder of the present invention.

FIG. 5 is a block diagram of a video encoder that uses the binary arithmetic code encoder of the present invention.

Block encoder 20, taking into consideration the estimated number of generated bits that are provided from bit number estimation unit 27, carries out the processes of motion vector search, motion compensation prediction, discrete integer transform, quantization, reverse quantization, reverse discrete integer transform, and an in-loop filter process for the input image and generates block information. The block information is information necessary for composing the stream, and contains information such as quantized conversion coefficients, quantization parameters, effective block patterns, prediction modes, and motion vectors.

The block information that is obtained is converted to a binary symbol string by binarization unit 21, and the result is stored in intermediate buffer 22.

Intermediate buffer 22 stores the binary symbol string that has been converted by binarization unit 21, and based on the instructions from arithmetic encoder 25, supplies binary symbols to arithmetic encoder 25. Intermediate buffer 22 further supplies the amount of accumulation to bit number estimation unit 27.

Reverse binarization unit 23, based on the binary symbol string that is obtained from intermediate buffer 22 and the composition information that is supplied from control unit 24, restores the block information and stores the information in memory 26. The block information that is here to be restored is the information that is referred to by control unit 24.

In accordance with the grammar of the stream, control unit 24 selects contexts from the binary symbols that are now to be encoded, and both acquires from memory 26 the probability estimate values and supplies the probability estimate values to arithmetic encoder 25. If necessary, control unit 24 uses the block information that is stored in memory 26 in the selection of the contexts. Upon obtaining binary symbols from intermediate buffer 22, control unit 24 both updates the probability estimate values that are stored in memory 26 and supplies the composition information of the binary symbol string to reverse binarization unit 23.

Arithmetic encoder 25 carries out binary arithmetic encoding based on the binary symbols obtained from intermediate buffer 22 and the probability estimate values obtained from control unit 24 and supplies the obtained stream as output. Arithmetic encoder 25 further supplies the number of binary symbols that have been read in arithmetic encoding and the number of bits of the generated code to the bit number estimation unit 27.

Bit number estimation unit 27 estimates the relation between the number of binary symbols and the number of code bits from the number of binary symbols and the number of code bits that are supplied from arithmetic encoder 25, converts the amount of accumulation that is supplied from intermediate buffer 22 to the number of bits to find the number of generated bits, and supplies the result to block encoder 20.

Block encoder 20, binarization unit 21, and bit number estimation unit 27, which are the block preceding intermediate buffer 22, execute processing matched to the bits, bytes, and byte string of the image that is applied as input to block encoder 20. In contrast, reverse binarization unit 23, control unit 24, arithmetic encoder 25, and memory 26, which are the block that succeeds intermediate buffer 22, carry out processing matched to the stream output. Binarization unit 21 and arithmetic encoder 25 therefore operate independently and normally carry out processing at different speeds. Intermediate buffer 22 absorbs the difference in processing speeds between the preceding and succeeding stages.

Figure 6:
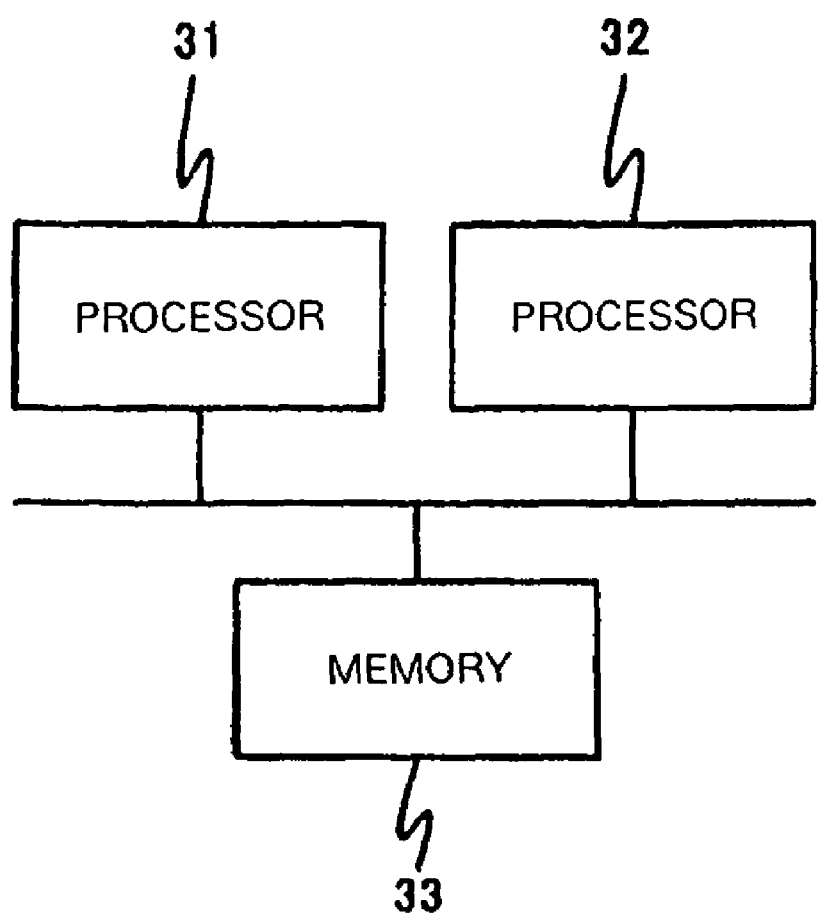
FIG. 6 is a block diagram of a binary arithmetic code decoder or encoder of the present invention.

FIG. 6 is a block diagram showing another embodiment of the present invention.

In constituting the decoder of the binary arithmetic code of the present invention shown in FIG. 6, processor 31 carries out decoding of the arithmetic code, and processor 32 carries out reverse binarization. Memory 33 can be accessed from processor 31 and processor 32, and holds the code string that is the input of processor 31, the binary symbol string that is the output of processor 31 and moreover, the input of processor 32, the multivalued symbols that are the output of processor 32, and the probability expectation and block information that are necessary in processing.

Processor 31 and processor 32 are divided in FIG. 6 to show the logical configuration, but when the operating system provides a multiprocessing capability, or when multiprocessing can be realized by a single processor such as a CPU that accommodates Intel's (U.S.) Hyper Threading, the two processors become one component. In addition, memory 33 need not be one memory, but may be of a configuration in which variables that are accessed from only processor 31 are not bus-connected but directly connected to processor 31.

Figure 7:
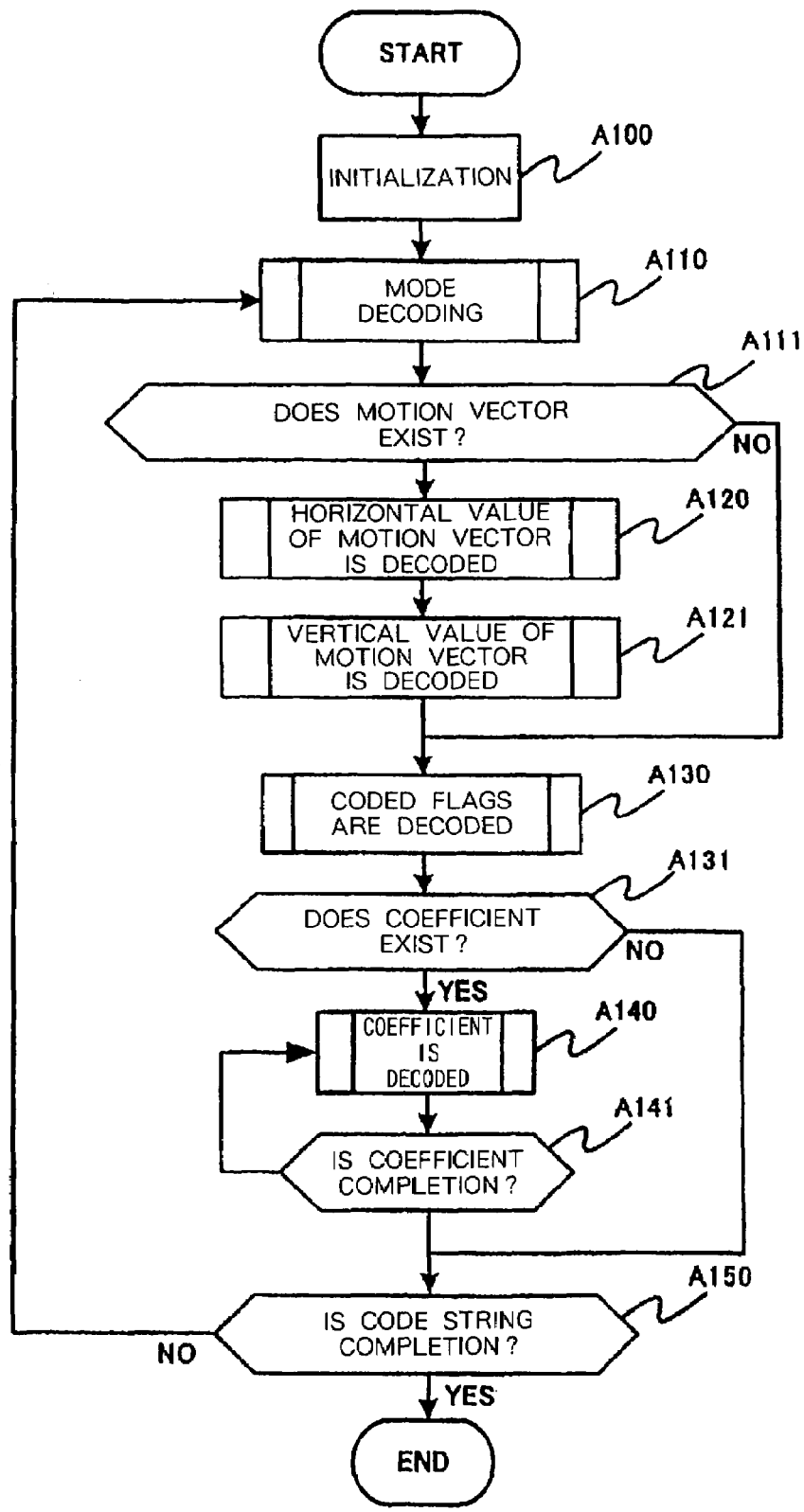
FIG. 7 is a flow chart showing the process of decoding binary arithmetic code according to the present invention.

Referring to FIG. 7, explanation next regards the operation when carrying out decoding of arithmetic code by processor 31.

Encoding syntax includes encoding modes, motion vectors, coded flags, and coefficients, and these are assumed to have undergone binary arithmetic coding. In this case, the existence of motion vector information can be learned from the encoding mode, and the existence of coefficients can be learned from coded flags.

Initialization is first carried out in Step A100. In initialization, probability estimate values are set to the initial value for each context. In Step A110, the encoding mode of a block is decoded. In Step A111, branching occurs depending on the existence of motion vector information. If motion vector information exists, the process advances to Step A120, and if motion vector information does not exist, the process advances to Step A130.

In Step A120, the horizontal value of the motion vector is decoded. The vertical value of the motion vector is decoded in Step A121. In Step A130, the coded flags are decoded. In Step A131, the process branches depending on the existence of coefficients. If a coefficient exists, the process advances to Step A140, but advances to Step A150 if a coefficient does not exist.

In Step A140, the coefficient is decoded. The operation branches at Step A141 depending on completion of the coefficient. If completed, the operation advances to Step A150, but if the coefficient continues, the operation proceeds to Step A140.

In Step A150, the operation branches depending on the completion of the code string. If not completed, the operation advances to Step A110.

In the decoding that is carried out in these steps, a subroutine for decoding multivalued symbols is summoned. In this subroutine, processor 31 performs the operations shown in FIG. 8.

Figure 8:
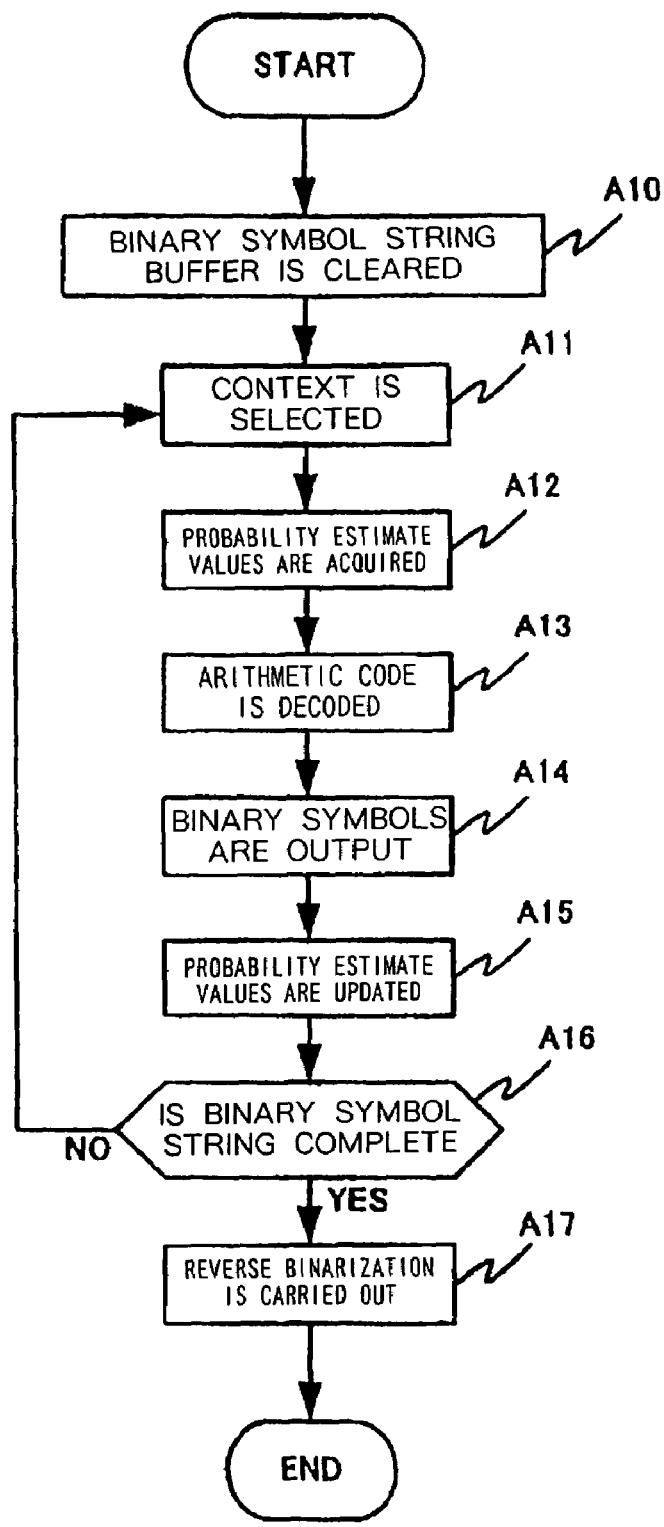
FIG. 8 is a flow chart of a subroutine of the decoding process of the present invention.

Explanation next regards the subroutine with reference to FIG. 8.

The symbol string buffer is first emptied in Step A10. In Step A11, a context that conforms to the current syntax is selected. If necessary, the information of neighboring blocks is used. In Step A12, the probability estimate values of the current context are acquired. In Step A13, arithmetic code is decoded. The input of code is awaited, and when received as input, the current values of code words are compared with the probability estimate values to obtain binary symbols from the size relation. If an operation that is symmetrical to the "0" and "1" of the binary symbols is performed, the probability estimate values can also be expressed by MPS values (symmetrical expression) and the probability estimate values of MPS. MPS are symbols for which the probability of occurrence has a high estimated value, the MPS probability estimate values taking values from 0.5 to 1. The obtained binary symbols are both stored in a symbol string buffer and supplied as output to memory in Step A14. In Step A15, the probability estimate values are updated in accordance with the values of the binary symbols. When the probability estimate values are symmetrical expressions and the MPS probability estimate values do not attain 0.5, the MPS is inverted. In Step A16, the operation branches depending on whether the binary symbol string in the symbol string buffer makes up a complete binary symbol string. If a complete binary symbol string is realized, the operation advances to Step A17, and if not, the operation returns to Step A11 to continue decoding of arithmetic code.

Reverse binarization is carried out in Step A17 as necessary. The conditions that govern necessity include elements relating to syntax and elements that may possibly be consulted in context selection.

Explanation next regards operation when carrying out reverse binarization by processor 32. The flow of the overall process operates according to the flow of FIG. 7, similar to processor 31. However, the summoned decoding subroutine differs from processor 31. The decoding subroutine that is used in processor 32 is reverse binarization, whereby multivalued symbols are decoded from a binary symbol string. Processor 32 has no relation to arithmetic code and therefore does not require the setting of probability estimate values to initial values in Step A100.

In FIG. 6, when the binary arithmetic code encoder of the present invention is realized, processor 31 performs binarization and processor 32 performs arithmetic encoding. Memory 33 can be accessed from processor 31 and processor 32, and holds information such as the multivalued symbols that are the input for processor 31, the binary symbol strings that are the output of processor 31, and moreover, the input of processor 32, the code strings that are the output of processor 32, and the probability estimate values and block information that are necessary in processing.

Figure 9:
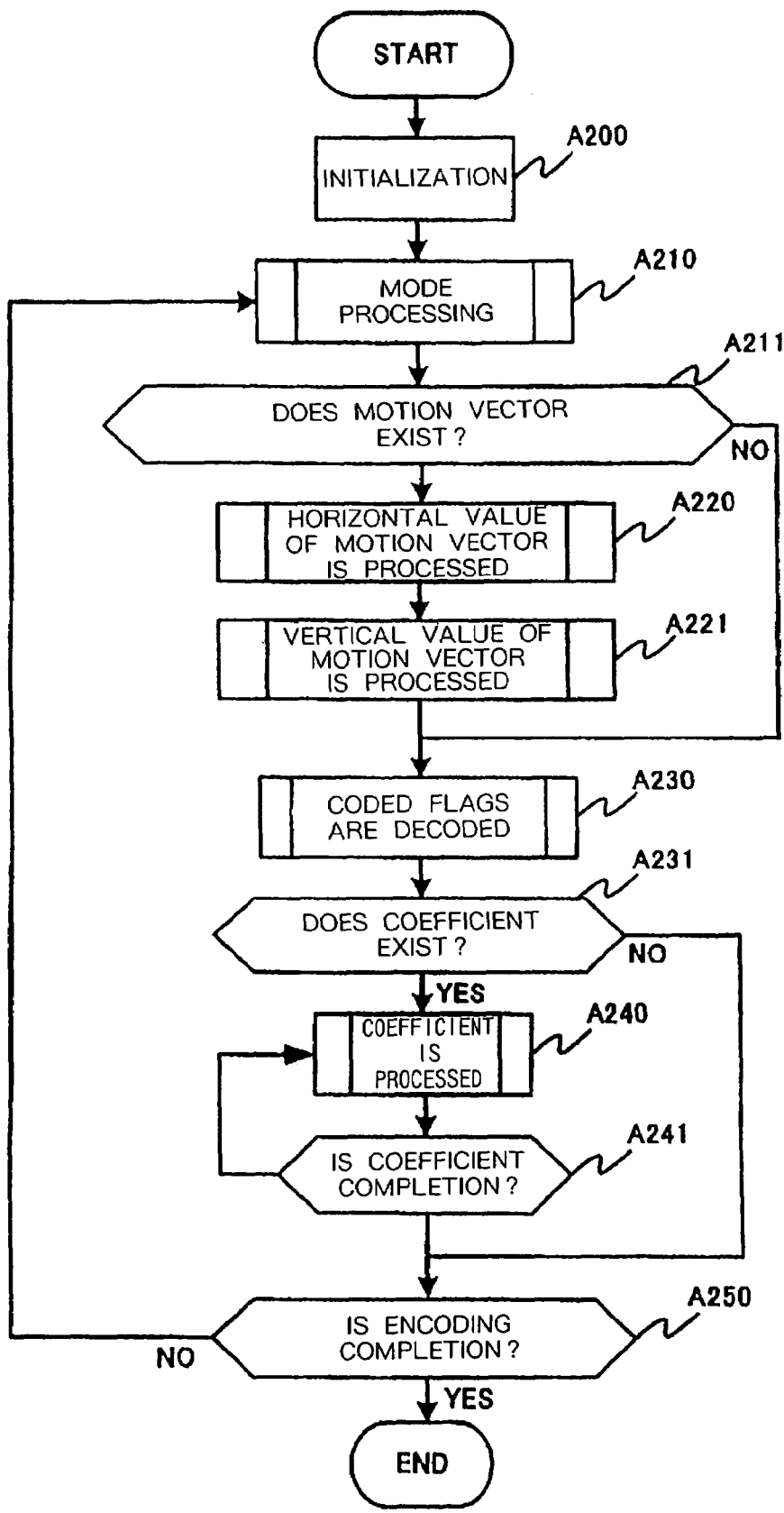
FIG. 9 is a flow chart showing the encoding process of binary arithmetic code of the present invention.

Explanation next regards the operation when carrying out binarization in processor 31 with reference to FIG. 9.

Initialization is first carried out in Step A200. In Step A210, an encoding process of the block encoding mode is carried out. In Step A211, the operation branches depending on the existence of motion vector information. If motion vector information exists, the operation advances to Step A220, but if information does not exist, the operation moves to Step A230.

In Step A220, the horizontal value of the motion vector is encoded. In Step A221, the vertical value of the motion vector is encoded. In Step A230, coded flags are encoded. In Step A231, the operation branches depending on whether coefficients exist. If there are coefficients, the operation advances to Step A240, but if there are no coefficients, the operation moves to Step A250.

In Step A240, the coefficients are encoded. In Step A241, the operation branches depending on whether the coefficients are completed. If completed, the operation moves to Step A250, but if the coefficients continue, the operation continues in Step A240.

In Step A250, the operation branches depending on whether encoding has been completed. If encoding has not been completed, the process moves to Step A210. The encoding process carried out in these steps is binarization, whereby an output subroutine is summoned for converting multivalued symbols to a binary symbol string and supplying the result as output. In the output subroutine, the number of binary symbols that are supplied as output are counted, and made available to allow reference from the outside.

Explanation next regards the operation when performing arithmetic encoding in processor 32. The overall flow of processing operates according to the flow of FIG. 9 as in processor 31. However, the initialization of Step A200 and the encoding process subroutine that is summoned differ from processor 31. In the encoding process subroutine that is used in processor 32, multivalued symbols are decoded from a binary symbol string by reverse binarization, and the binary symbol string is subjected to arithmetic encoding. In carrying out arithmetic encoding, probability expectation is set to initial value in the initialization of Step A200.

Figure 10:
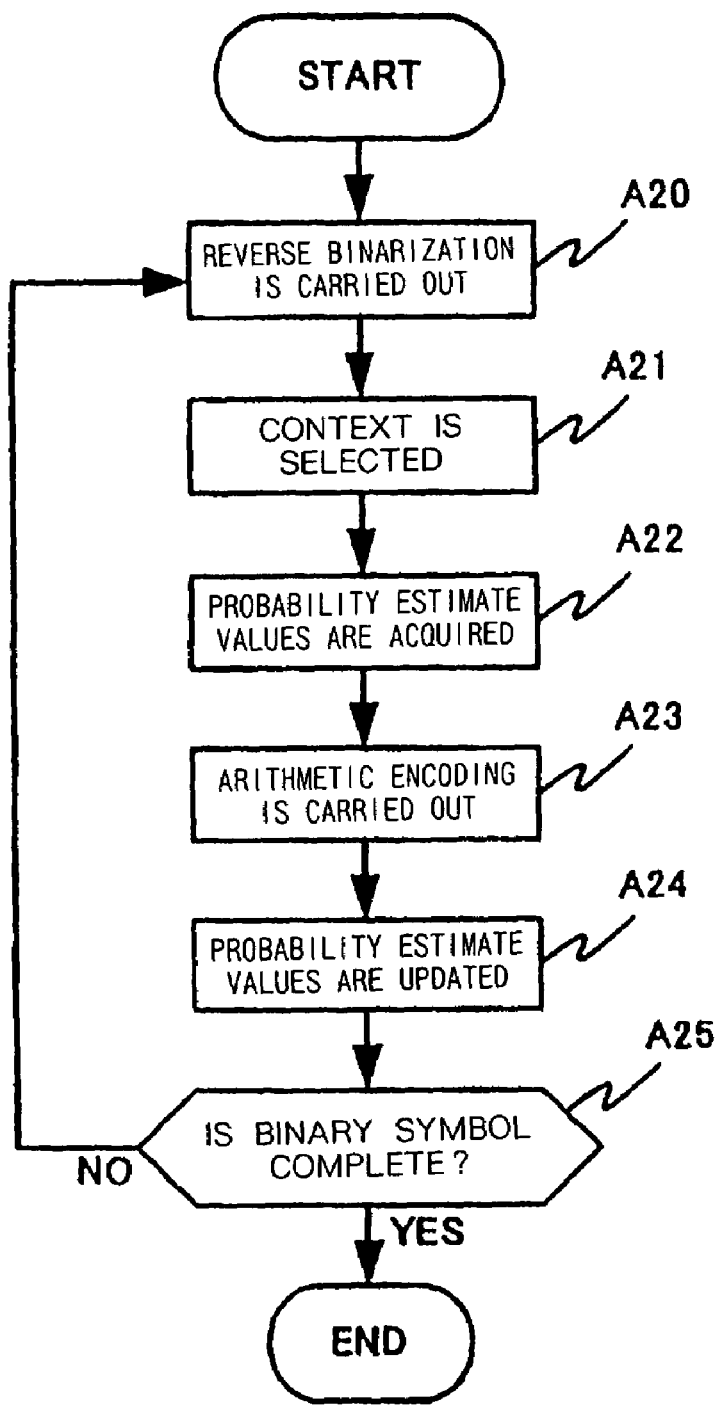
FIG. 10 is a flow chart of a subroutine of the encoding process of the present invention.

Explanation next regards the operation of the encoding process subroutine of processor 32 with reference to FIG. 10.

First, in Step A20, reverse binarization is carried out whereby multivalued symbols are supplied as output and the corresponding binary symbol string is stored in symbol string buffer. In Step A21, probability estimate values of the current context are acquired.

In Step A23, one binary symbol is extracted from the head of the symbol string buffer, arithmetic encoding carried out, and the result supplied as output. The number of instances of arithmetic encoding and the number of generated bits are counted and made available for reference from the outside.

In Step A24, the probability estimate values are updated in accordance with the values of binary symbols. If the probability estimate values are symmetrical expressions, MPS is inverted when the MPS probability estimate value is less than 0.5. In Step A25, the operation branches depending on whether the symbol string buffer is empty or not. If the symbol string buffer is empty, the operation ends, but if the symbol string buffer is not empty, the operation returns to Step A21 to continue arithmetic encoding.

The number of binary symbols that are supplied as output in processor 31 and the number of instances of arithmetic encoding and the number generated bits in processor 32 are found. The number of binary symbols stored in memory is found by subtracting the number of instances of arithmetic encoding from the number of binary symbols that have been supplied as output. In addition, the relation between the number of binary symbols and the number of code bits can be found from the number of instances of arithmetic encoding and the number of generated bits. The estimated generated bit number can be calculated from these values. The estimated generated bit number may be calculated in the output subroutine of processor 31 and made available for reference from the outside, or may be calculated outside from the values that are the basis.

Explanation next regards an example in which the above-described decoder for decoding binary arithmetic code and encoder are realized by a computer system.

The computer system is equipped with a CPU, and the CPU is connected to a buffer and a memory.

In the memory, a program is stored for executing the decoding process and encoding process of the present invention. The decoding process and encoding process of the present invention are executed by the execution of this program by the CPU.

A case of handling binary arithmetic code has been described in the above-described embodiments, but the present invention is not limited to applications to binary arithmetic code. If quaternary arithmetic code is to be used, the quaternary arithmetic code decoder and encoder of the present invention can be realized by simply changing binary to quaternary in the figures and explanation. Even when binary and ternary arithmetic codes are mixed, the invention may be configured to switch from the processing of binary arithmetic code to the processing of ternary arithmetic code to match the context.

Although an embodiment of the present invention was described that takes as an example a video decoder and video encoder, the present invention is not limited to applications to these forms. The present invention can easily be applied to a speech decoder and speech encoder by replacing block decoder 17 with a speech frame decoder and block encoder 20 with a speech frame encoder. The binary arithmetic code decoder and encoder of the present invention can further be applied to other encoders and decoders of other media or data that use binary arithmetic code, similarly to video and speech.

The invention claimed is:

1. A decoder of binary arithmetic code comprising:
   a memory for storing probability estimate values of arithmetic code that are necessary for decoding;
   an arithmetic code decoder for using said probability estimate values to decode binary arithmetic code that is received as input to obtain binary symbols;
   a buffer for accumulating said binary symbols that have been decoded;
   a first data decoder for extracting said binary symbols from said buffer to decode said binary symbols and obtain output data; and
   a second data decoder for, based on said binary symbols that have been decoded, decoding data that are necessary for stream grammar analysis and updating said probability estimate values.

2. A decoder of arithmetic code comprising:
   a memory for storing probability estimate values of arithmetic code that are necessary for decoding;
   an arithmetic code decoder for using said probability estimate values to decode multivalued arithmetic code that is received as input to obtain multivalued symbols;
   a buffer for accumulating said multivalued symbols that have been decoded;
   a first data decoder for extracting multivalued symbols from said buffer to decode said multivalued symbols and obtain output data; and
   a second data decoder for, based on said multivalued symbols that have been decoded, decoding data that are necessary for stream grammar analysis and updating said probability estimate values.

3. An encoder of binary arithmetic code, comprising:
   a binarization unit for converting binary arithmetic code that has been received as input to binary symbols;
   a buffer for accumulating said binary symbols;
   an arithmetic encoder for extracting binary symbols from said buffer to generate arithmetic code; and
   a bit number estimation unit for estimating the relation between the number of binary symbols and the number of code bits from the number of binary symbols that have been extracted by said arithmetic encoder and the number of code bits that have been generated, and for estimating the number of code bits that are generated after arithmetic encoding from the amount of accumulation of said buffer.

4. An encoder of arithmetic code, comprising:
   a multivalue conversion unit for converting multivalued arithmetic code that has been received as input to multivalued symbols;
   a buffer for accumulating said multivalued symbols;
   an arithmetic encoder for extracting multivalued symbols from said buffer and generating arithmetic code; and
   a bit number estimation unit for estimating the relation between the number of multivalued symbols and the number of code bits from the number of multivalued symbols that have been extracted by said arithmetic encoder and the number of code bits that have been generated, and for estimating the number of code bits that are generated after arithmetic encoding from the amount of accumulation of said buffer.

5. A method of decoding binary arithmetic code in a decoder that includes a buffer for accumulating binary symbols that have been decoded; said method comprising:
   an arithmetic code decoding step of using a probability estimate values to decode binary arithmetic code that is received as input to obtain binary symbols; and
   a first data decoding step of extracting said binary symbols from said buffer to decode said binary symbols and obtain output data; and
   a second data decoding step of, based on said binary symbols that have been decoded, decoding data necessary for stream grammar analysis and updating said probability estimate values.

6. A method of decoding arithmetic code in a decoder that includes a buffer for accumulating decoded multivalued symbols; said method comprising:
   an arithmetic code decoding step of using a probability estimate values to decode multivalued arithmetic code that is received as input to obtain multivalued symbols;
   a first data decoding step of extracting said multivalued symbols from said buffer to decode said multivalued symbols and obtain output data; and
   a second data decoding step of, based on said multivalued symbols that have been decoded, decoding data that are necessary for stream grammar analysis and updating said probability estimate values.

7. A method of encoding binary arithmetic code in an encoder having a buffer for accumulating binary symbols that have been converted, said method comprising:
   a binarization step of converting binary arithmetic code that has been received as input to binary symbols;
   an arithmetic encoding step of extracting binary symbols from said buffer to generate arithmetic code; and
   a bit number estimation step of estimating the relation between the number of binary symbols and the number of code bits from the number of binary symbols that have been extracted and the number of code bits that have been generated, and of estimating the number of code bits that are generated after arithmetic encoding from the amount of accumulation of said buffer.

8. A method of encoding arithmetic code in an encoder having a buffer for accumulating multivalued symbols that have been converted, said method comprising:
   a multivalue conversion step of converting multivalued arithmetic code that has been received as input to multivalued symbols;
   an arithmetic encoding step of extracting multivalued symbols from said buffer to generate arithmetic code; and
   a bit number estimation step of estimating the relation between the number of multivalued symbols and the number of code bits from the number of multivalued symbols that have been extracted and the number of code bits that have been generated, and of estimating the number of code bits that are generated after arithmetic encoding from the amount of accumulation of said buffer.

9. A program stored on a computer readable medium for causing a computer having a buffer for accumulating binary symbols that have been decoded to execute steps, said program causing said computer to execute:
   an arithmetic code decoding step of using said probability estimate values to decode binary arithmetic code that has been received to obtain binary symbols;
   a first data decoding step of extracting said binary symbols from said buffer to decode binary symbols and obtain output data; and
   a second data decoding step of, based on said binary symbols that have been decoded, decoding data necessary for stream grammar analysis and updating said probability estimate values.

10. A program stored on a computer readable medium for causing a computer having a buffer for accumulating multivalued symbols that have been decoded to execute steps, said program causing said computer to execute:

an arithmetic code decoding step of using said probability estimate values to decode multivalued arithmetic code that has been received as input to obtain multivalued symbols;

a first data decoding step of extracting said multivalued symbols from said buffer to decode said multivalued symbols and obtain output data; and a second data decoding step of, based on said multivalued symbols that have been decoded, decoding data necessary for stream grammar analysis and updating said probability estimate values.

11. A program stored on a computer readable medium for causing a computer having a buffer for accumulating binary symbols that have been decoded to execute steps, said program causing said computer to execute:

a binarization step of converting binary arithmetic code that has been received as input to binary symbols;

an arithmetic encoding step of extracting binary symbols from said buffer to generate arithmetic code; and a bit number estimation step of estimating the relation between the number of binary symbols and the number of code bits from the number of binary symbols that have been extracted by said arithmetic encoder and the number of code bits that have been generated, and of estimating the number of code bits that are generated after arithmetic encoding from the amount of accumulation of said buffer.

12. A program stored on a computer readable medium for causing a computer having a buffer for accumulating multivalued symbols that have been decoded to execute steps, said program causing said computer to execute:

a multivalue conversion step of converting multivalued arithmetic code that has been received as input to multivalued symbols;

an arithmetic encoding step of extracting multivalued symbols from said buffer to generate arithmetic code; and a bit number estimation step of estimating the relation between the number of multivalued symbols and the number of code bits from the number of multivalued symbols that have been extracted by said arithmetic encoder and the number of code bits that have been generated, and of estimating the number of code bits that are generated after arithmetic encoding from the amount of accumulation of said buffer.

* * * * *